United States Patent
Nobutoki et al.

(10) Patent No.: US 7,423,924 B2
(45) Date of Patent: Sep. 9, 2008

(54) SEMICONDUCTOR MEMORY DEVICE

(75) Inventors: Tomoko Nobutoki, Tokyo (JP); Ken Ota, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/589,708

(22) Filed: Oct. 31, 2006

(65) Prior Publication Data

US 2007/0253267 A1    Nov. 1, 2007

(30) Foreign Application Priority Data

Oct. 31, 2005  (JP)  ............................. 2005-316463

(51) Int. Cl.
  *G11C 7/02*   (2006.01)
(52) U.S. Cl. .................. 365/207; 365/205; 365/230.03
(58) Field of Classification Search ................. 365/207, 365/205, 69, 230.03
  See application file for complete search history.

(56) References Cited

U.S. PATENT DOCUMENTS 5,010,524 A * 4/1991 Fifield et al. ................ 365/205
5,016,224 A * 5/1991 Tanaka et al. .......... 365/230.03
7,106,626 B2 * 9/2006 Goldman et al. ....... 365/185.03

FOREIGN PATENT DOCUMENTS

| JP | 2-166690 A | 6/1990 |
|---|---|---|
| JP | 63-148489 A | 6/1998 |
| JP | 2000-123574 A | 4/2000 |
| KR | 1995-0008671 B1 | 8/1995 |

* cited by examiner

*Primary Examiner*—Huan Hoang
(74) *Attorney, Agent, or Firm*—Sughrue Mion, PLLC

(57) ABSTRACT

In a semiconductor memory device which includes a shared sense amplifier portion, a pair of memory cell portions disposed on opposite sides of the shared sense amplifier portion, a pair of transfer gates between the pair of memory cell portions and the shared sense amplifier portion, and bit lines constituting a plurality of bit line pairs and connecting the pair of memory cell portions to each other through the pair of transfer gates and the shared sense amplifier portion, the bit lines in a bit line pair of the plurality of bit line pairs are twisted at a substantial center between the pair of transfer gates on the opposite sides.

9 Claims, 8 Drawing Sheets

SEMICONDUCTOR MEMORY DEVICE

BACKGROUND OF THE INVENTION

This application claims priority to prior Japanese patent application JP 2005-316463, the disclosure of which is incorporated herein by reference.

This invention relates to a semiconductor memory device and, in particular, to a shared sense amplifier circuit or portion.

In recent years, a semiconductor memory device is more and more improved towards a larger capacity and higher integration. In a dynamic random access memory (hereinafter will be abbreviated to a DRAM), products having a memory capacity of 1 Gbit are developed. By increasing the memory capacity, the semiconductor memory device is miniaturized. In order to increase the memory capacity, various proposals have been made.

In the DRAM having a large capacity, a shared sense amplifier portion is used. The sense amplifier portion is supplied with data selectively from memory cells on opposite sides of the sense amplifier portion and carries out a sensing operation. Further, word lines for controlling the memory cells are not directly inputted from a row decoder to the memory cells but a divisional decoding system is used. Following an increase in operation speed of the semiconductor memory device, use is made of a clocking method of temporarily disconnecting a memory cell portion and a sense amplifier portion upon sensing in order to increase a sensing speed. In this method, clocking is performed by providing a transfer gate for disconnecting the memory cell portion and the sense amplifier portion. A whole capacity of a bit line pair (D/DB) is not charged and discharged but a part in the sense amplifier portion alone is amplified at a high speed.

As a countermeasure against a noise between bit lines, the bit lines are twisted inside a memory cell array to reduce a coupling noise between adjacent bit lines and to avoid an operation error due to the noise. Thus, the shared sense amplifier portion, the clocking method using the transfer gate, and the noise countermeasure have been proposed and put into practical use. In the present status, however, following the increase in scale and the miniaturization, several problems arise around the sense amplifier portion for supplying and receiving data to and from the memory cells.

Referring to FIGS. 1 to 4, those problems in the present status will be described. Referring to FIG. 1, an existing sense amplifier portion SA is connected to left and right transfer gates TG-L/R and left and right memory cell arrays MA-L/R via bit line pairs D/DB. The sense amplifier portion SA is of a shared type. Memory cells are arranged at intersecting points of bit lines and word lines. For example, description will be made of an operation in case where one of the word lines of the left memory cell array MA-L is selected. The left transfer gate TG-L is activated and a potential difference is produced in the bit line pair D/DB. The word lines of the right memory cell array MA-R and the transfer gate TG-R are inactivated. The bit line pairs D/DB of the right memory cell array MA-R are disconnected from the sense amplifier portion SA.

The sense amplifier portion SA can perform signal amplification once the potential difference in the bit line pair D/DB is obtained. Therefore, when the potential difference in the bit line pair D/DB is obtained in the sense amplifier portion, the left memory cell array MA-L is disconnected again by the left transfer gate TG-L. By amplifying a part in the sense amplifier portion SA alone in the above-mentioned manner, a sensing speed can be increased. Data amplified by the sense amplifier portion SA and read out pass through a main amplifier to be outputted from an input/output circuit. Simultaneously, the left transfer gate TG-L is activated again and rewriting into the memory cells is carried out. When the data reading operation and the rewriting operation into the memory cells are completed, the left transfer gate TG-L is disconnected. Then, a next cycle is started.

In the shared sense amplifier portion, the memory cells MA-L/R and the sense amplifier portion SA are disconnected by the transfer gates TG-L/R. In order to increase the sensing speed, a whole capacity of the bit line pair D/DB is not charged or discharged upon sensing. Instead, use is made of the clocking method of temporarily disconnecting the memory cell arrays MA-L/R and the sense amplifier portion SA and amplifying a part in the sense amplifier portion SA alone. After amplification by the sense amplifier portion SA, the memory cell arrays MA-L/R and the sense amplifier portion SA are connected again by the transfer gates TG. Thus, by the use of the transfer gates TG, clocking is performed to switch connection/disconnection/connection. In this manner, the reading operation can be carried out at a high speed.

Referring to FIG. 2, two sets of the sense amplifiers and the transfer gates are adjacent to each other. The bit lines from the memory cells are connected to the sense amplifier portion SA via the transfer gates TG-L/R. Two sets of the bit lines D/DB in the sense amplifiers are depicted by A/B and D/E as illustrated in the figure. In case of a CMOS circuit, each of the sense amplifiers comprises two CMOS inverter circuits each of which is loop-connected. The CMOS inverter circuit comprises a PMOS region provided with a load MOS transistor and a NMOS region provided with a driver MOS transistor. As power supplies, a high power supply voltage SAP and a low power supply voltage SAN are applied. Each sense amplifier of the sense amplifier portion SA amplifies data from a selected memory cell.

Referring to FIG. 3, the layout around the sense amplifiers in FIG. 2 will be described. Herein, only two sets of the bit line pairs A/B and D/E are shown. By repeating this layout, an array is formed. In FIG. 3, each of the PMOS transistor and the NMOS transistor forming the sense amplifier is implemented by a straight channel. For example, in the NMOS region, the transistors on the left side use the bit lines A and E as drains, C as a source, and the bit lines B and D as gates. The bit lines A and E are connected to the drains by bit contacts. The source C is shared. The gates are connected to the bit lines B and D by gate poly contacts. The transistors on the right side use the bit lines B and D as drains, C as a source, and the bit lines A and E as gates. The source C is shared with the adjacent sense amplifier.

Referring to FIG. 4, description will be made of the layout of a second existing sense amplifier portion. In FIG. 4, transistors of the sense amplifier are implemented by a ring-shaped channel. The channel in a ring shape avoids the Kink effect and, therefore, effectively reduces an unbalance. The transistors on the left side in the figure use the bit lines A and D as drains, C as a source, and the bit lines B and E as gates. The transistors on the right side use the bit lines B and E as drains, C as a source, and the bit lines A and D) as gates. The source C is shared. The layout is applicable to both of the drive-side NMOS transistor and the load-side PMOS transistor of the sense amplifier.

As an operation of the above-mentioned sense amplifier portion, clocking is performed by the use of the transfer gates TG so that the capacity of the bit line connected to the sense amplifier upon activation is relatively small. This is suitable for a high-speed operation. However, as illustrated in FIGS. 3 and 4, the bit lines B and D are adjacent to each other throughout a whole area in the sense amplifier portion. Therefore, the sensing speed is decreased by a noise from the adjacent bit line. In the worst case, judgment error is caused to occur.

In the semiconductor memory device in which clocking is performed by the use of the transfer gate TG, an adjacent coupling noise in the sense amplifier portion is not negligible although it was negligible in the past. In the existing sense amplifier portion, specific bit lines are adjacent to each other throughout the whole area in the sense amplifier portion so that the sensing speed is decreased in response to a noise from the adjacent bit line and, in the worst case, judgment error is caused to occur. The reason why the first problem arises is that miniaturization advances in recent years and the influence of the adjacent coupling noise in the sense amplifier portion is increased.

The countermeasure against a noise between the bit lines and the reduction in area of the sense amplifier are disclosed in the following patent documents. In Japanese Unexamined Patent Application Publication (JP-A) No. S63-148489, intersecting points are provided inside a memory cell array and bit lines are twisted at the intersecting points. By twisting the bit lines, a coupling noise between the adjacent bit lines is suppressed and an operation error due to the noise is avoided. However, the intersecting points are required to twist the bit lines so that the layout area is increased. In Japanese Unexamined Patent Application Publication (JP-A) No. 2000-123574, bit lines of a sense amplifier and a main bit line are made to intersect each other at connection points (selector switches YSW) between the bit lines of the sense amplifier and the main bit line. In Japanese Unexamined Patent Application Publication (JP-A) No. H2-166690, a diffusion layer of the sense amplifier is shared so as to reduce an area. However, any of the above-mentioned patent documents does not raise a problem about generation of a noise between wirings in the sense amplifier and does not describe the countermeasure against the problem.

As described above, the above-mentioned patent documents are addressed to the countermeasure against a noise between the bit lines disposed on the memory cell array and do not describe a countermeasure against the problem of generation of a noise between wirings in the sense amplifier portion because of unawareness of the problem. However, following the advancement of miniaturization and use of the clocking method, the bit lines in the sense amplifier portion are closely adjacent to one another. As a consequence, the influence of the adjacent coupling noise is increased to become unnegligible. However, as compared with the capacity of a whole of the bit lines, the influence is small. Therefore, in the layout of the existing sense amplifier portion, no consideration is made about twisting the bit lines in the sense amplifier portion.

The reason is as follows. In case where the bit lines are twisted in the sense amplifier portion, another wiring layer must be used via a contact so that the layout area is increased. In the conventional technique, there is no idea about twisting the bit lines in the sense amplifier portion, which is accompanied with an increase in layout area. Therefore, the problem about generation of a noise between wirings inside the sense amplifier portion is left unsolved.

SUMMARY OF THE INVENTION

It is therefore an object of this invention to provide a sense amplifier portion which is small in area and which is capable of reducing a noise between adjacent bit lines in the sense amplifier portion.

It is another object of this invention to provide a semiconductor memory device having the above-mentioned sense amplifier portion.

The sense amplifier portion according to this invention is characterized in that the bit lines are twisted inside the sense amplifier portion. By twisting the bit lines inside the sense amplifier portion within a small area, it is possible to reduce the influence of an adjacent coupling noise in the sense amplifier portion.

In order to achieve the above-mentioned objects, this invention basically adopts the following techniques. It will readily be understood that this invention includes various applied techniques modified in various manners within the technical gist of this invention.

That is, semiconductor memory devices according to this invention and sense amplifier portions according to this invention are as follows:

(1) A semiconductor memory device comprising:
a shared sense amplifier portion;
a pair of memory cell portions disposed on opposite sides of the shared sense amplifier portion;
a pair of transfer gates disposed on the opposite sides of the shared sense amplifier portion and between the pair of memory cell portions and the shared sense amplifier portion; and
bit lines which constitute a plurality of bit line pairs and which connect the pair of memory cell portions to each other through the pair of transfer gates and the shared sense amplifier portion;
the bit lines in a bit line pair of the plurality of bit line pairs being twisted at a substantial center between the pair of transfer gates on the opposite sides.

(2) The semiconductor memory device according to the above-mentioned structure (1), wherein each of the pair of transfer gates carries out clocking to temporarily disconnect each of the pair of memory cell portions and the shared sense amplifier portion and to thereby amplify an inside part of the shared sense amplifier portion.

(3) The semiconductor memory device according to the above-mentioned structure (1), wherein the shared sense amplifier portion comprises a first shared sense amplifier with the bit lines in the bit line pair of the plurality of bit line pairs twisted and a second t shared sense amplifier with the bit lines in a different bit line pair of the plurality of bit line pairs untwisted, the first and the second shared sense amplifiers being alternately arranged.

(4) The semiconductor memory device according to the above-mentioned structure (1), wherein the bit lines in the bit line pair are twisted by a ring-shaped gate electrode of a transistor in the shared sense amplifier portion.

(5) The semiconductor memory device according to the above-mentioned structure (4), wherein a part of the gate electrode is used as a wiring.

(6) The semiconductor memory device according to the above-mentioned structure (1), wherein the bit lines in the bit line pair are twisted by a wiring layer formed in a well isolating region of the shared sense amplifier portion.

(7) A shared sense amplifier portion for use in a semiconductor memory device comprising: a pair of memory cell portions disposed on opposite sides of the shared sense amplifier portion; a pair of transfer gates disposed on the opposite sides of the shared sense amplifier portion and between the pair of memory cell portions and the shared sense amplifier portion; and bit lines which constitute a plurality of bit line pairs and which connect the pair of memory cell portions to each other through the pair of transfer gates and the shared sense amplifier portion; wherein the bit lines in a bit line pair of the plurality of bit line pairs are twisted at a position corresponding to a substantial center between the pair of transfer gates on the opposite sides.

(8) The shared sense amplifier portion according to the above-mentioned structure (7), wherein the bit lines in the bit line pair are twisted by a ring-shaped gate electrode of a transistor.

(9) The shared sense amplifier portion according to the above-mentioned structure (8), wherein a part of the gate electrode is used as a wiring.

(10) The shared sense amplifier portion according to the above-mentioned structure (7), wherein the bit lines in the bit line pair are twisted by a wiring layer formed in a well isolating region.

The sense amplifier of the semiconductor memory device according to this invention is a shared sense amplifier of a clocking system in which the transfer gates are provided to disconnect a memory cell portion and a sense amplifier portion upon sensing, thereby amplifying a part in the sense amplifier portion alone. In the sense amplifier at a substantial center between the left and the right transfer gates bit lines in the bit line pair are twisted. By twisting the bit lines in alternate bit line pairs, an adjacent coupling noise is canceled. Thus, there is provided a sense amplifier capable of performing a high-speed stable operation without increasing the layout area and without being affected by an adjacent coupling noise. There is also provided a semiconductor memory device having the above-mentioned sense amplifier.

DESCRIPTION OF THE PREFERRED EMBODIMENTS

Figure 1:
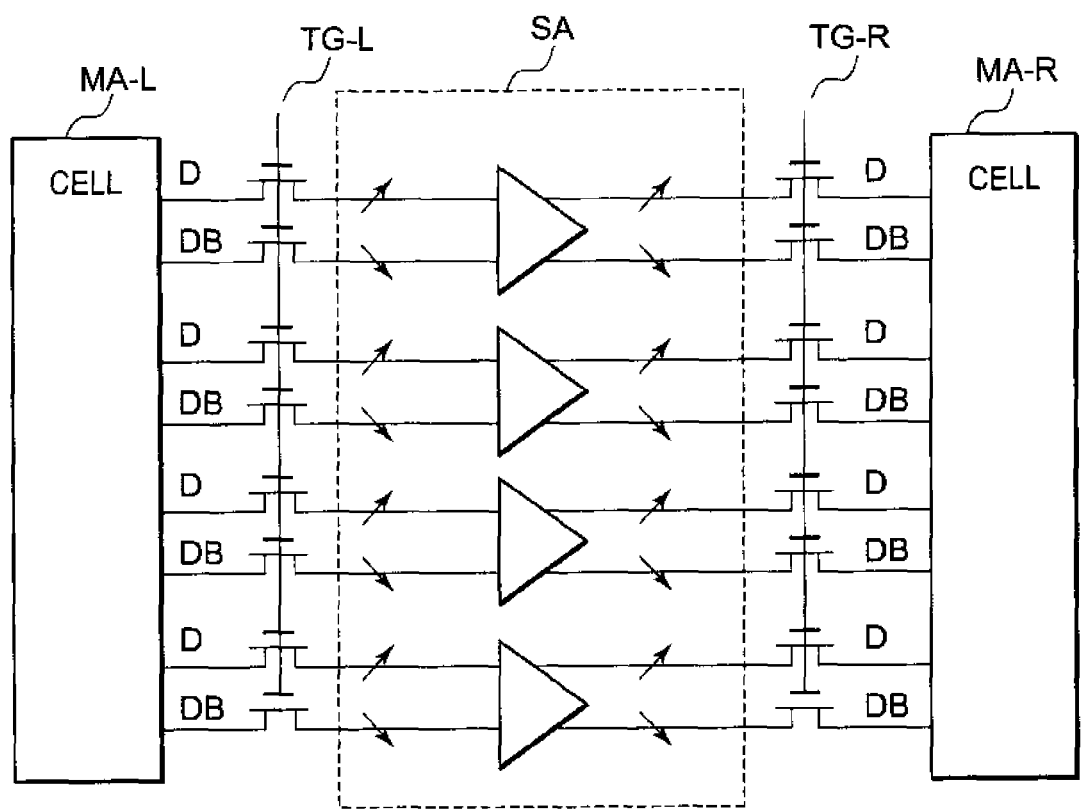
FIG. 1 is a block diagram around an existing sense amplifier portion.
Figure 2:
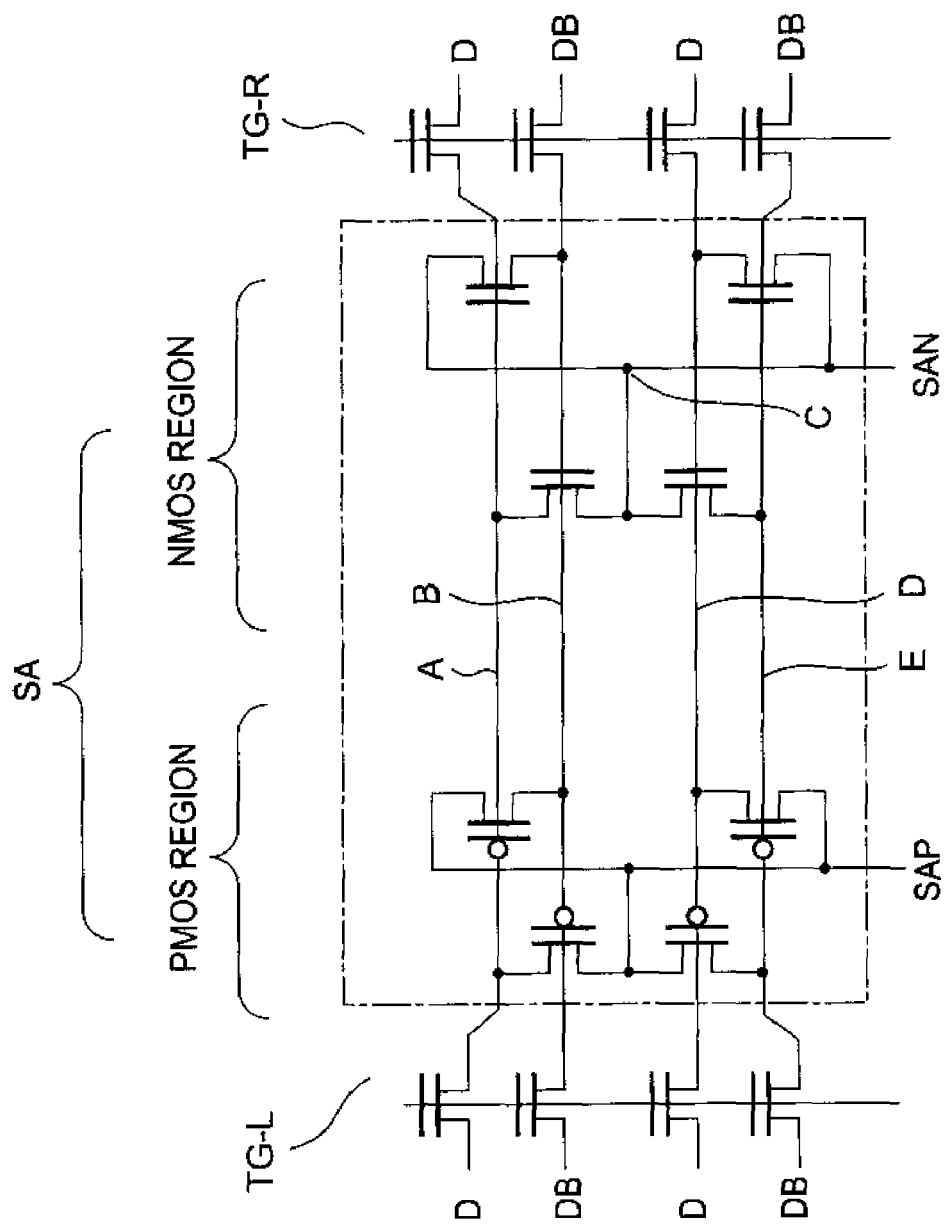
FIG. 2 is a circuit diagram around the sense amplifier portion illustrated in FIG. 1.
Figure 3:
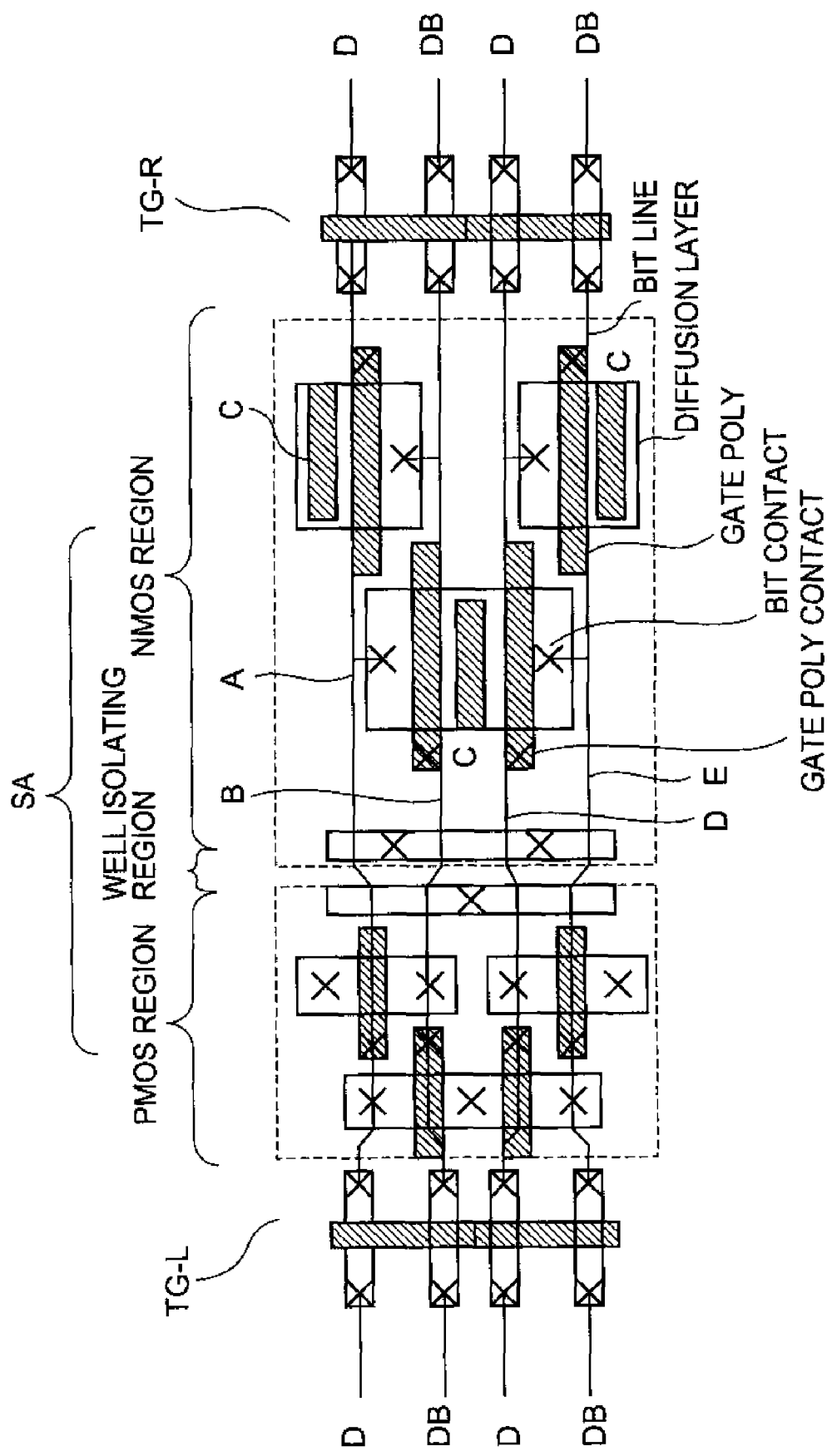
FIG. 3 shows a layout around the sense amplifier portion illustrated in FIG. 2.
Figure 4:
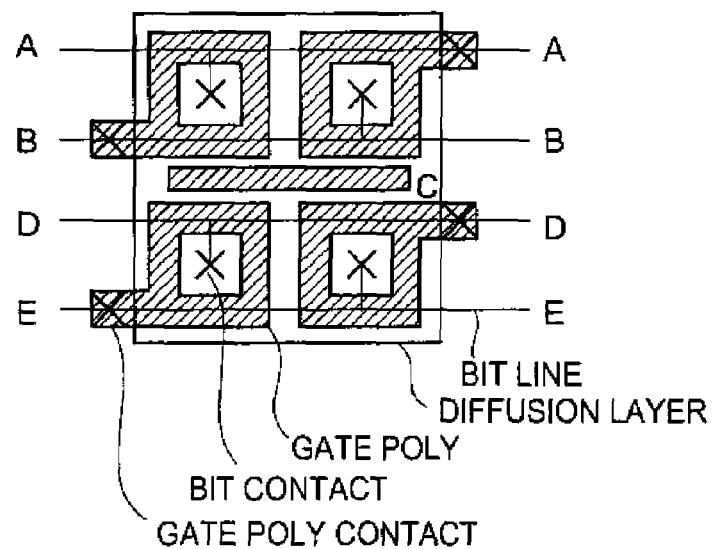
FIG. 4 shows a layout of transistors of a second existing sense amplifier portion.

Preferred embodiments of this invention will be described in detail with reference to the drawing.

First Embodiment

Referring to FIGS. 5 to 9, a first embodiment will be described.

Figure 5:
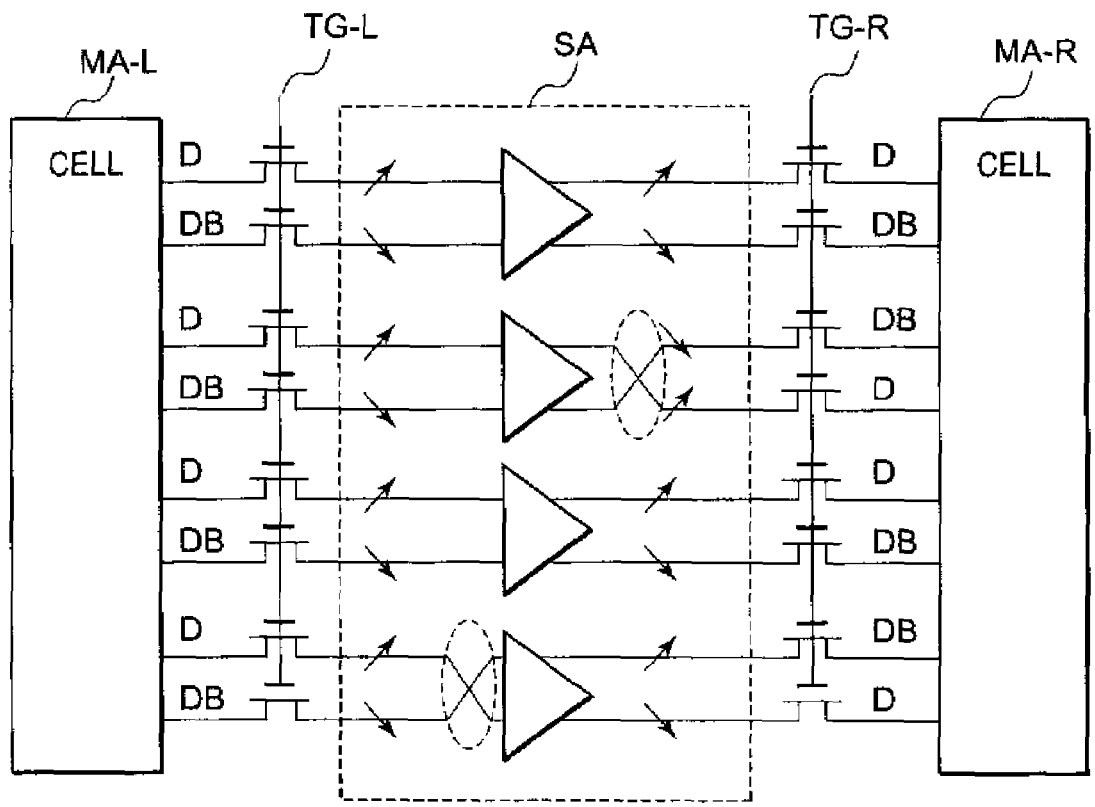
FIG. 5 is a block diagram around a sense amplifier portion according to this invention.

Referring to FIG. 5, a sense amplifier portion SA is provided with transfer gates TG-L/R and memory cell arrays MA-L/R arranged left and right and connected via bit line pairs D/DB. The sense amplifier portion SA is of a shared type. Memory cells are disposed at intersecting points of bit lines and word lines. For example, description will be made of an operation in case where one of the word lines of the left memory cell array MA-L is selected. The left transfer gate TG-L is activated and a potential difference between potentials from the memory cells is produced in the bit line pair D/DB. The word lines of the right memory cell array MA-R and the transfer gate TG-R are inactivated. The bit line pairs D/DB of the right memory cell array MA-R are disconnected from the sense amplifier portion SA.

The sense amplifier portion SA can perform signal amplification once the potential difference in the bit line pair D/DB is obtained. Therefore, when the potential difference in the bit line pair D/DB is obtained in the sense amplifier portion, the left memory cell array MA-L is disconnected again by the left transfer gate TG-L. By amplifying a part in the sense amplifier portion SA alone in the above-mentioned manner, a sensing speed can be increased. Data amplified by the sense amplifier portion SA and read out pass through a main amplifier to be outputted from an input/output circuit. Simultaneously, the left transfer gate TG-L is activated again and rewriting into the memory cells is carried out. When the data reading operation and the rewriting operation into the memory cells are completed, the left transfer gate TG-L is disconnected. Then, a next cycle is started.

In the shared sense amplifier portion, the memory cell arrays MA-L/R and the sense amplifier portion SA are disconnected by the transfer gates TG-L/R. In order to increase the sensing speed, a whole capacity of the bit line pair D/DB is not charged or discharged upon sensing. Instead, use is made of the clocking method of temporarily disconnecting the memory cell arrays MA-L/R and the sense amplifier portion SA and amplifying a part in the sense amplifier portion SA alone. After amplification by the sense amplifier portion SA, the memory cell arrays MA-L/R and the sense amplifier portion SA are connected again by the transfer gates TG. Thus, by the use of the transfer gates TG, clocking is performed to switch connection/disconnection/connection. In this manner, the reading operation can be carried out at a high speed.

If specific bit lines are adjacent to each other throughout an entire area of the sense amplifier portion SA, the sensing speed may be decreased in response to a noise from the adjacent bit line. Further, judgment error may be caused to occur. In view of the above, the bit lines in alternate ones of sense amplifiers adjacent to one another are twisted around the center inside the sense amplifier portion SA. By twisting the bit lines, the adjacent coupling noise is canceled. For example, the bit lines in each of the second and the fourth sense amplifiers as counted from the above in FIG. 5 are twisted. It is assumed that, in each bit line pair, the bit line D and the bit line DB are changed into a high level and a low level, respectively. The bit line DB in the first bit line pair is changed into a low level. However, in the second bit line pair twisted at the center, latter halves of the bit line D of a high level and the bit line DB of a low level are reversed in position. Therefore, an adjacent noise is canceled.

Figure 6:
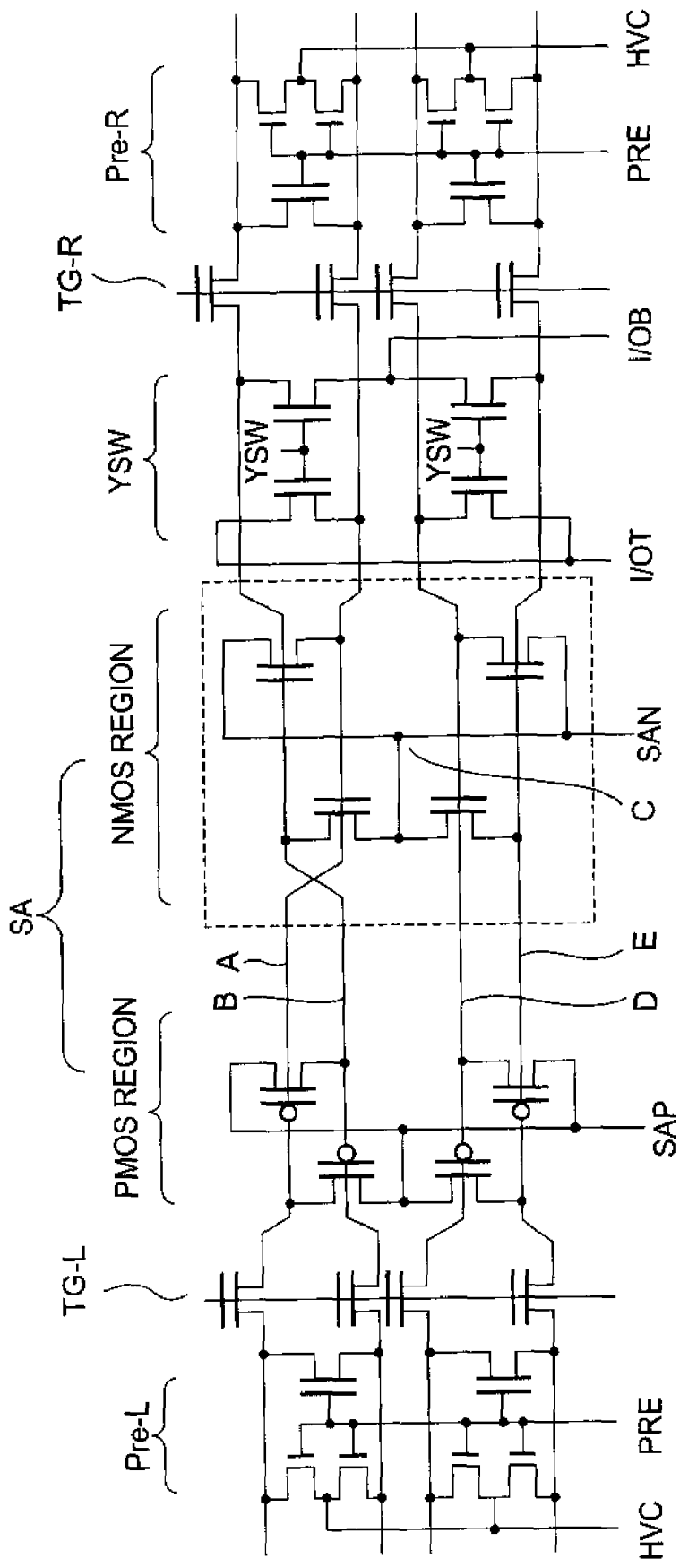
FIG. 6 is a circuit diagram around the sense amplifier portion illustrated in FIG. 5.

The bit lines are twisted by the use of the layout of the sense amplifier portion SA such that the layout area is not increased. Referring to FIG. 6, a structure around the sense amplifier portion comprises a left bit line precharge circuit Pre-L, a left transfer gate TG-L, the sense amplifier portion SA, a selective connection switch YSW for selectively connecting IO paths (I/OT, I/OB), a right transfer gate TG-R, a right bit line precharge circuit Pre-R. The left bit line precharge circuit Pre-L/R is supplied with a precharge signal PRE and a precharge potential HVC and precharges the bit lines when it is not accessed. The selective connection switch YSW transmits to the I/O paths (I/OT, I/OB) data on the bit line pair selected by a column selection signal.

Figure 7:
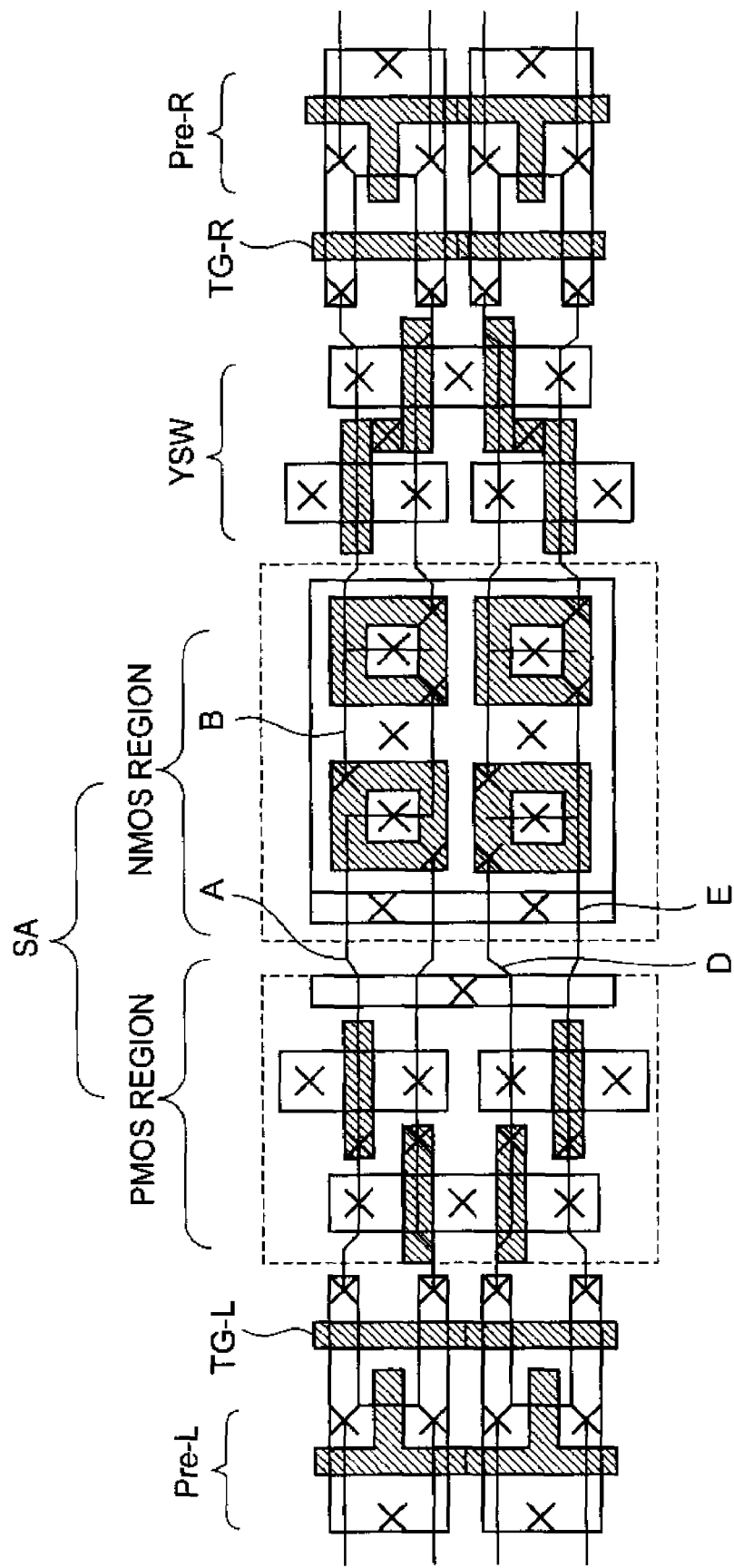
FIG. 7 shows a layout around the sense amplifier portion illustrated in FIG. 6.

Referring to FIG. 7, the bit lines A and B in the bit line pair are twisted at the NMOS transistor portion of the sense amplifier portion. FIG. 7 shows the layout corresponding to the circuit diagram in FIG. 6. The layout includes the left bit line precharge circuit Pre-L, the left transfer gate TG-L, the sense amplifier portion SA, the selective connection switch YSW for the I/O paths, the right transfer gate TG-R, and the right bit line precharge circuit Pre-R. In FIG. 7, since the sense amplifier portion is disconnected by the transfer gates TG, the bit lines in the sense amplifier portion are represented by upper bit line pair AB and next bit line pair D/E in the vertical direction. Herein, the bit lines A and B in the bit line pair intersect on the side of the NMOS transistor. Alternatively, the bit lines A and B in the bit line pair may intersect on the side of the PMOS transistor.

Figure 8:
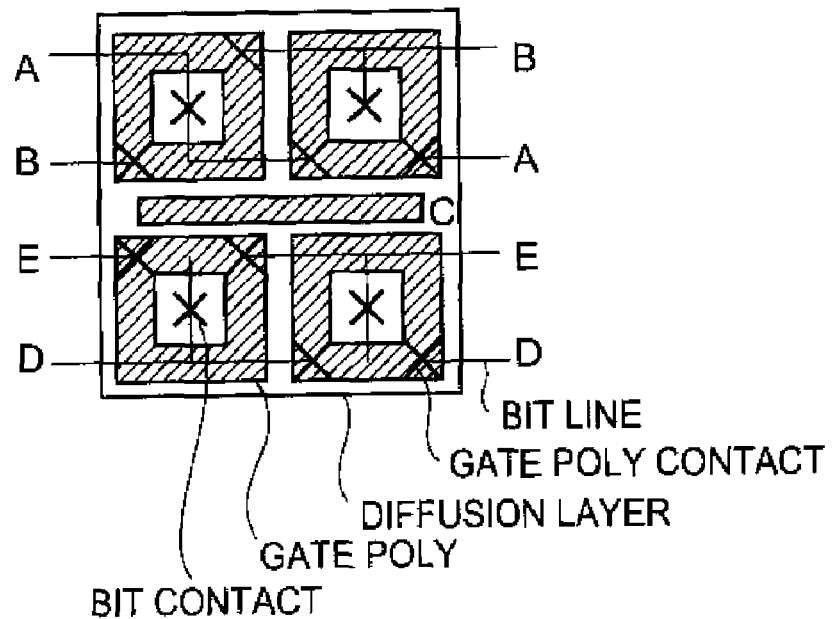
FIG. 8 shows a layout of an intersecting portion in a first embodiment.

Referring to FIG. 8, the intersecting portion where the bit lines are twisted is illustrated in detail. In FIG. 8, two pairs of bit lines A/B and D/E and a common node C are shown. A driver transistor of the sense amplifier portion is implemented by a ring-shaped channel. The channel in a ring shape avoids the Kink effect and, therefore, effectively reduces an unbalance. In recent years, an operation voltage is lowered and the unbalance of the sense amplifier portion must be reduced as described above. The object of this invention (to cancel a coupling noise between adjacent bit lines) is one of the approaches to reduce the unbalance. Therefore, in combination with a ring gate, a synergistic effect is expected.

The bit line A wired from the left side is connected to a drain by a bit contact and is connected to a gate of the right adjacent transistor by a gate poly contact. A part of the gate electrode of the transistor is used as a wiring. One side of the ring-shaped gate electrode is used as a wiring and the bit line A is extracted from the other end thereof. On the other hand, the bit line B wired from the left side is connected to the gate electrode and is extracted again from a position halfway around the ring-shaped gate electrode. Herein, two sides of the ring-shaped gate electrode are used as wirings and the bit line B is extracted from a diagonal corner. The bit line B is connected to a drain by a bit contact. The bit lines E and D in the second bit line pair do not intersect but is wired straight.

The bit line adjacent to the bit line E of the second bit line pair is B and A on the left side and the right side in FIG. 8, respectively. If the bit lines A and B operate complementarily, the adjacent coupling noise is canceled. In order to cancel the noise, the transistor with the bit lines twisted (upper left transistor in FIG. 8) is desirably disposed around the center of the sense amplifier. For example, as illustrated in FIG. 7, in the layout of the sense amplifier SA and the selective connection switch YSW for the I/O paths, the center portion is a NMOS transistor portion of the sense amplifier. However, the intersecting portion is not limited to the NMOS transistor portion. It is important that the intersecting portion is a substantial center of a portion disconnected by the left and the right transfer gates. Herein, the substantial center must be the center such that the noise between adjacent bit lines is substantially canceled.

Figure 9:
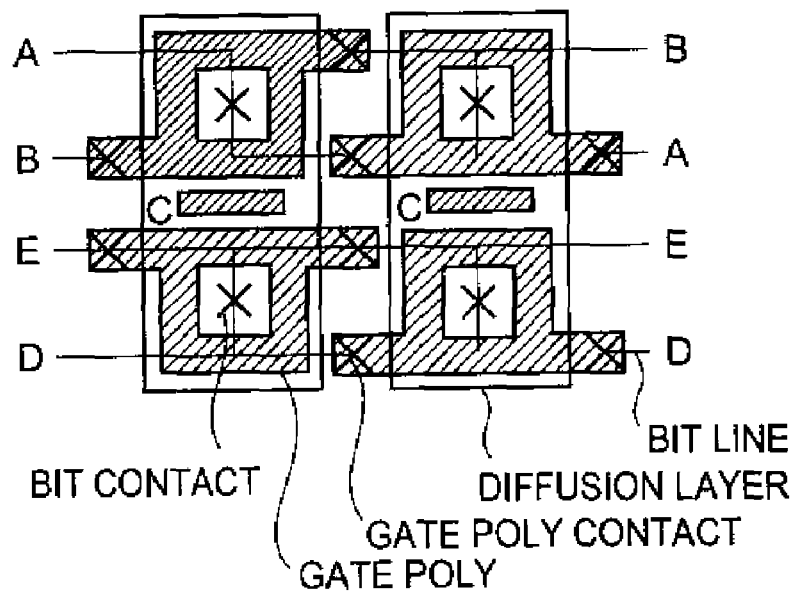
FIG. 9 shows a modified layout of the intersecting portion in FIG. 8.

Referring to FIG. 9, a modification of FIG. 8 is illustrated. In FIG. 8, the gate poly and the bit line are connected by the contact on the channel. However, if inhibited in the process, a diffusion layer under the contact may be deleted. Alternatively, the gate poly is extracted from the channel to a position above a field (insulating region) and the gate poly contact is formed on the field, as illustrated in FIG. 9.

In this embodiment, the gate electrode of the transistor forming the sense amplifier is used as a wiring and the bit lines are twisted. In the transistor region of the sense amplifier, which corresponds to a substantial center between the left and the right transfer gates, the bit lines in the bit line pair are twisted. By twisting the bit lines in alternate bit line pairs, the adjacent coupling noise is canceled. Thus, there is obtained a sense amplifier capable of performing a high-speed stable operation by twisting the bit lines in the bit line pair without increasing the layout area so as to eliminate the influence of the adjacent coupling noise in the sense amplifier. There is also obtained a semiconductor memory device having the above-mentioned sense amplifier.

Second Embodiment

Figure 10:
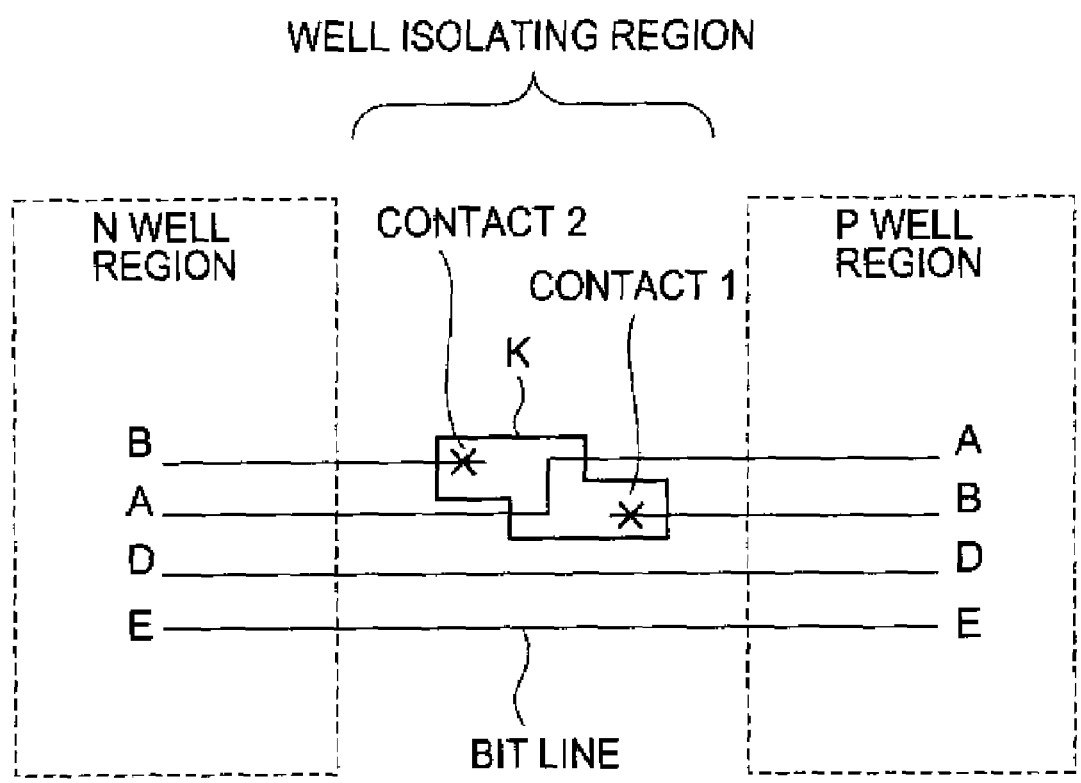
FIG. 10 shows a layout of an intersecting portion in a second embodiment.

Referring to FIG. 10, a second embodiment of this invention will be described. In this embodiment, an intersecting portion is formed in a PN well isolating region of the sense amplifier portion.

Referring to FIG. 10, the sense amplifier portion includes a PMOS as a load transistor for raising the bit lines to a power supply potential and a NMOS as a drive transistor for discharging to a ground potential GND. The two types of transistors PMOS and NMOS are formed in a N-well region and a P-well region different in impurity type. In order to isolate the P-well and the N-well regions, a predetermined region is required. By the use of the predetermined region, the bit lines are twisted.

In the two pairs of the bit lines A, B and D, E, the bit lines A and B in the bit line pair are twisted via an additional wiring layer K. For example, the bit line B is wired as the additional wiring layer K via contacts 1 and 2 and the bit line A is twisted on the additional wiring layer K. In order to twist the bit line, the additional wiring layer is used via the contacts. However, by the use of the well isolating region, the area is not increased. The bit lines D and E in the bit line pair are not exchanged in arrangement order. The bit line adjacent to the bit line D is A and B on the left side and the right side in FIG. 10, respectively. If the bit lines A and B complementarily operate, the adjacent coupling noise is canceled. In order to cancel the noise, the position where the bit line is twisted (the additional wiring layer K) is desirably disposed around the center of the sense amplifier portion.

In this embodiment, the intersecting portion where the bit line is twisted is arranged in the PN well isolating region of the sense amplifier. In the PN well isolating region of the sense amplifier at a substantial center between the left and the right transfer gates, the bit lines in the bit line pair are twisted. By twisting the bit lines in alternate pairs, the adjacent coupling noise is canceled. Thus, there is obtained a sense amplifier capable of performing a high-speed stable operation by twisting the bit lines in the bit line pair without increasing the layout area so as to eliminate the influence of the adjacent coupling noise in the sense amplifier portion. There is also obtained a semiconductor memory device having the above-mentioned sense amplifier portion.

The semiconductor memory device according to this invention adopts the shared sense amplifier. Further, the semiconductor memory device comprises the transfer gates for disconnecting the memory cell portion and the sense amplifier portion upon sensing to perform clocking, thereby amplifying a part in the sense amplifier portion alone. In the sense amplifier at a substantial center between the left and the right transfer gates, the bit lines in the bit line pair are twisted. By twisting the bit lines in alternate pairs, the adjacent coupling noise is canceled. Thus, there is obtained a sense amplifier capable of performing a high-speed stable operation by twisting the bit lines in the bit line pair without increasing the layout area so as to eliminate the influence of the adjacent coupling noise in the sense amplifier. There is also obtained a semiconductor memory device having the above-mentioned sense amplifier.

Although this invention has been described in conjunction with a few preferred embodiments thereof, this invention is not limited to the foregoing embodiments but may be modified in various other manners within the scope of the appended claims.

What is claimed is:

1. A semiconductor memory device comprising:
a shared sense amplifier portion;
a pair of memory cell portions disposed on opposite sides of the shared sense amplifier portion;
a pair of transfer gates disposed on the opposite sides of the shared sense amplifier portion and between the pair of memory cell portions and the shared sense amplifier portion; and
bit lines which constitute a plurality of bit line pairs and which connect the pair of memory cell portions to each other through the pair of transfer gates and the shared sense amplifier portion,
wherein the bit lines in a bit line pair of the plurality of bit line pairs are twisted at a substantial center between the pair of transfer gates on the opposite sides, and
wherein the shared sense amplifier portion comprises a first shared sense amplifier with the bit lines in the bit line pair of the plurality of bit line pairs twisted and a second shared sense amplifier with the bit lines in a different bit line pair of the plurality of bit line pairs untwisted, the first and the second shared sense amplifiers being alternately arranged.

2. The semiconductor memory device according to claim 1, wherein each of the pair of transfer gates carries out clocking to temporarily disconnect each of the pair of memory cell portions and the shared sense amplifier portion and to thereby amplify an inside part of the shared sense amplifier portion.

3. The semiconductor memory device according to claim 1, wherein the bit lines in the bit line pair are twisted by a ring-shaped gate electrode of a transistor in the shared sense amplifier portion.

4. The semiconductor memory device according to claim 3, wherein a part of the gate electrode is used as a wiring.

5. The semiconductor memory device according to claim 1, wherein the bit lines in the bit line pair are twisted by a wiring layer formed in a well isolating region of the shared sense amplifier portion.

6. A shared sense amplifier portion for use in a semiconductor memory device comprising: a pair of memory cell portions disposed on opposite sides of the shared sense amplifier portion; a pair of transfer gates disposed on the opposite sides of the shared sense amplifier portion and between the pair of memory cell portions and the shared sense amplifier portion; and bit lines which constitute a plurality of bit line pairs and which connect the pair of memory cell portions to each other through the pair of transfer gates and the shared sense amplifier portion; wherein
the bit lines in a bit line pair of the plurality of bit line pairs are twisted at a position corresponding to a substantial center between the pair of transfer gates on the opposite sides, and
wherein the shared sense amplifier portion comprises a first shared sense amplifier with the bit lines in the bit line pair of the plurality of bit line pairs twisted and a second shared sense amplifier with the bit lines in a different bit line pair of the plurality of bit line pairs untwisted, the first and the second shared sense amplifiers being alternately arranged.

7. The shared sense amplifier portion according to claim 6, wherein the bit lines in the bit line pair are twisted by a ring-shaped gate electrode of a transistor.

8. The shared sense amplifier portion according to claim 7, wherein a part of the gate electrode is used as a wiring.

9. The shared sense amplifier portion according to claim 6, wherein the bit lines in the bit line pair are twisted by a wiring layer formed in a well isolating region.

* * * * *